(12) United States Patent
Lu et al.

(10) Patent No.: US 10,658,239 B2
(45) Date of Patent: May 19, 2020

(54) WAFER DICING METHOD

(71) Applicants: Semiconductor Manufacturing International (Beijing) Corporation, Beijing (CN); Semiconductor Manufacturing International (Shanghai) Corporation, Shanghai (CN)

(72) Inventors: Lihui Lu, Shanghai (CN); Chunchao Fei, Shanghai (CN); Po Yuan Chiang, Shanghai (CN); Yaping Wang, Shanghai (CN)

(73) Assignees: Semiconductor Manufacturing International (Beijing) Corp., Beijing (CN); Semiconductor Manufacturing International (Shanghai) Corp., Shanghai (CN)

( * ) Notice: Subject to any disclaimer, the term of this patent is extended or adjusted under 35 U.S.C. 154(b) by 0 days.

(21) Appl. No.: 16/106,690

(22) Filed: Aug. 21, 2018

(65) Prior Publication Data

US 2019/0181045 A1 Jun. 13, 2019

(30) Foreign Application Priority Data

Dec. 12, 2017 (CN) .......................... 2017 1 1316378

(51) Int. Cl.
*H01L 21/301* (2006.01)
*H01L 21/46* (2006.01)
(Continued)

(52) U.S. Cl.
CPC .......... *H01L 21/78* (2013.01); *B23K 26/0006* (2013.01); *B23K 26/0093* (2013.01); *B23K 26/40* (2013.01); *B23K 26/53* (2015.10); *B23K 26/57* (2015.10); *H01L 21/304* (2013.01); *H01L 21/6836* (2013.01); *B23K 2101/40* (2018.08); *B23K 2103/50* (2018.08); *H01L 2221/68327* (2013.01)

(58) Field of Classification Search
CPC .... H01L 21/78; H01L 21/304; H01L 21/6836
USPC ........................................ 438/460, 462, 464
See application file for complete search history.

(56) References Cited

U.S. PATENT DOCUMENTS

2003/0230804 A1* 12/2003 Kouno ................ H01L 23/3114
257/734
2007/0077685 A1* 4/2007 Noda ................ H01L 21/67092
438/107

(Continued)

*Primary Examiner* — David S Blum
(74) *Attorney, Agent, or Firm* — Brinks Gilson & Lione

(57) ABSTRACT

This disclosure provides wafer dicing methods, and relates to the field of semiconductor technologies. Implementations of the dicing method may include: performing laser stealth dicing processing on a wafer from a back surface of the wafer; performing grinding and thinning processing on the back surface of the wafer after performing the laser stealth dicing processing; sticking a dicing tape on the back surface of the wafer after performing the grinding and thinning processing; and performing separation processing on the wafer after sticking the dicing tape. In some implementations, stealth dicing (SD) is performed before grinding, so that a laser is directly imposed on a back surface of a wafer, thereby alleviating a laser attenuation problem and lowering requirements on light transmittance of a dicing tape.

7 Claims, 4 Drawing Sheets

(51) Int. Cl.
*H01L 21/78* (2006.01)
*B23K 26/40* (2014.01)
*B23K 26/53* (2014.01)
*B23K 26/00* (2014.01)
*H01L 21/683* (2006.01)
*H01L 21/304* (2006.01)
*B23K 26/57* (2014.01)
*B23K 101/40* (2006.01)
*B23K 103/00* (2006.01)

(56) References Cited

U.S. PATENT DOCUMENTS

| | | | |
|---|---|---|---|
| 2007/0111480 A1* | 5/2007 | Maruyama | B23K 26/009 438/463 |
| 2014/0179083 A1* | 6/2014 | Buenning | H01L 21/78 438/463 |
| 2016/0071770 A1* | 3/2016 | Albermann | H01L 21/6836 257/797 |
| 2017/0271208 A1* | 9/2017 | Koshimizu | H01L 21/78 |
| 2018/0174983 A1* | 6/2018 | Zhang | H01L 23/562 |
| 2019/0164784 A1* | 5/2019 | Wongratanaporngoorn | H01L 21/568 |

* cited by examiner

WAFER DICING METHOD

RELATED APPLICATIONS

The present application claims priority to Chinese Patent Appln. No. 201711316378.2, filed Dec. 12, 2017, the entire disclosure of which is hereby incorporated by reference.

BACKGROUND

Technical Field

The present disclosure relates to the field of semiconductor technologies, and in particular, to a wafer dicing method.

Related Art

Multiple chips of a multi-project wafer (MPVV) can be formed on one wafer, and therefore, the wafer may be diced into multiple chips. A stealth dicing (SD) method is a commonly used wafer dicing method. FIG. 1 is a schematic structural top view in which a wafer is diced into multiple chips. As shown in FIG. 1, by means of the SD method, the wafer 10 is diced into four chips 101, 102, 103, and 104. In addition, a dicing line 12 is further shown in FIG. 1. The SD method can improve the service life (die strength) of an integrated circuit (IC) card, reduce a dicing width, and the like.

The SD method utilizes a laser within a particular wavelength range on a Si layer of a chip so that a wafer is in a semi-dicing state. Since an oxide of silicon and metal cannot be diced using a laser, and usually, there is an oxide layer of silicon and a metal layer on a front surface of the wafer, dicing from the front surface of the wafer requires the absence of metal in a dicing line. A size of the laser should also be controlled. Since usually there is no oxide layer of silicon and no metal layer on a back surface of the wafer, laser stealth dicing is usually implemented from the back surface of the wafer. In a process of implementing the laser stealth dicing from the back surface of the wafer, a dicing tape usually needs to be stuck on the back surface of the wafer to protect the wafer.

SUMMARY

The inventors of this disclosure have found that in the prior art, in a process of implementing laser stealth dicing from a back surface of a wafer, a laser needs to pass through a dicing tape, thereby causing laser attenuation. To reduce the attenuation, the dicing tape needs to be an expensive tape of high light transmittance, leading to relatively high costs.

A technical problem to be resolved in embodiments and implementations of this disclosure is to provide a wafer dicing method to alleviate a laser attenuation problem.

In one aspect of the present disclosure, a wafer dicing method is provided. The method may include: performing laser stealth dicing processing on a wafer from a back surface of the wafer; performing grinding and thinning processing on the back surface of the wafer after performing the laser stealth dicing processing; sticking a dicing tape on the back surface of the wafer after performing the grinding and thinning processing; and performing separation processing on the wafer after sticking the dicing tape.

In some implementations, the method further includes: before performing the laser stealth dicing processing, sticking a protection tape on a front surface of the wafer; and after sticking the dicing tape and before performing the separation processing on the wafer, removing the protection tape.

In some implementations, the method further includes: before sticking the protection tape on a front surface of the wafer, performing grooving processing on the front surface of the wafer to form a dicing line, where in the step of performing laser stealth dicing processing, a dicing path of the laser stealth dicing is aligned with the dicing line.

In some implementations, a metal layer is formed on the front surface of the wafer, where in the step of performing grooving processing on the front surface of the wafer, the metal layer is etched to form the dicing line.

In some implementations, the step of performing separation processing on the wafer includes: fixing the wafer on a support platform using the dicing tape; and performing expansion processing on the dicing tape after fixing the wafer on the support platform, where in a process of performing the expansion processing on the dicing tape, the wafer is separated into multiple chips.

In some implementations, in the process of performing the expansion processing on the dicing tape, heating processing is further performed on the dicing tape.

In some implementations, after the grinding and thinning processing is performed on the back surface of the wafer, the thickness of the wafer after the wafer is thinned is less than or equal to 50 micrometers.

In some implementations, the width of the dicing line is greater than the width of the dicing path of the laser stealth dicing.

In some implementations, the width of the dicing line is less than or equal to 20 micrometers; and the width of the dicing path is less than or equal to 2 micrometers.

In some implementations, the wafer is a silicon chip.

In forms of the dicing method in the foregoing embodiments, before a dicing tape is stuck on a back surface of a wafer, laser stealth dicing processing is performed on the wafer from the back surface of the wafer, so that in a process of performing the laser stealth dicing processing, a laser is directly imposed on the back surface of the wafer, thereby alleviating a laser attenuation problem. In addition, the method can lower requirements on light transmittance of the dicing tape and reduce costs.

The following describes exemplary embodiments and implementations of this disclosure in detail with reference to the accompanying drawings, so that other features and advantages of this disclosure may become clear.

BRIEF DESCRIPTION OF THE DRAWINGS

The accompanying drawings that form a part of the specification are intended to describe embodiments and implementations of this disclosure and are used to explain the principles of this disclosure together with the specification.

Referring to the accompanying drawings, this disclosure may be understood more clearly according to detailed descriptions below, where.

DETAILED DESCRIPTION

Various exemplary embodiments and implementations of this disclosure are described in detail with reference to the accompanying drawings. It should be noted that, unless otherwise specifically described, relative arrangement, numerical expressions, and numerical values of components and steps described in the embodiments and implementations do not limit the scope of this disclosure.

In addition, it should be understood that for ease of description, the size of each part shown in the accompanying drawings is not drawn according to an actual proportional relationship.

The following descriptions of at least one exemplary embodiment are merely illustrative and should not be construed as a limitation to this disclosure and application or use of this disclosure.

Techniques, methods, and devices known to a person of ordinary skill in the relevant art may not be discussed in detail. However, in appropriate cases, the techniques, methods, and devices should be considered as a part of the specification.

In all examples shown and discussed herein, any specific value should be considered as exemplary rather than as a limitation. Therefore, other examples of exemplary embodiments and implementations may have different values.

It should be noted that, similar numbers and letters represent similar items in the following accompanying drawings. Therefore, once an item is defined in an accompanying drawing, the item does not need to be further discussed in the following accompanying drawings.

The inventors of this disclosure have found that in the prior art, in a process of implementing laser stealth dicing from a back surface of a wafer, a laser needs to pass through a dicing tape, causing laser attenuation. To reduce the attenuation, the dicing tape needs to be an expensive tape of high light transmittance, leading to relatively high costs.

To address the foregoing problem, embodiments and implementations of this disclosure provide wafer dicing methods that provide laser stealth dicing with a laser needing to pass through a dicing tape. The following describes in detail wafer dicing methods according to some embodiments and implementations of this disclosure.

Figure 1:
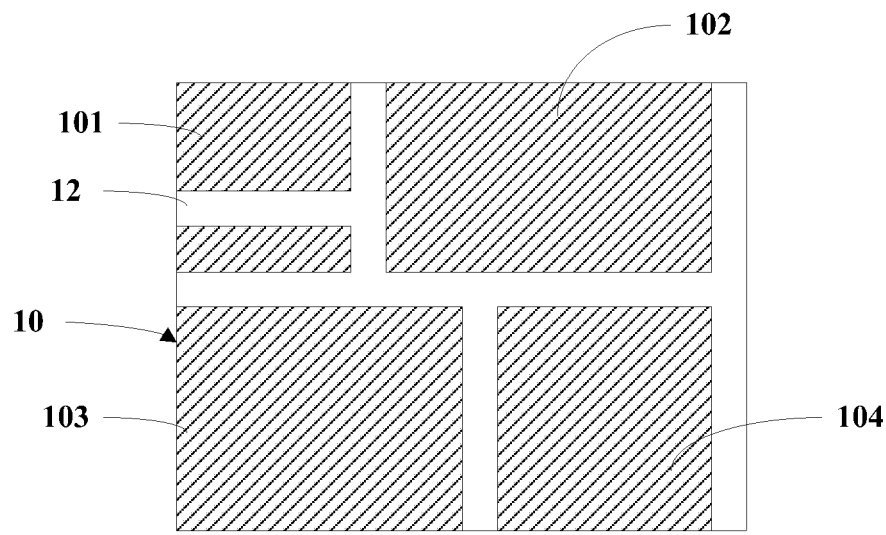
FIG. 1 is a schematic structural top view in which a wafer is diced into multiple chips.
Figure 2:
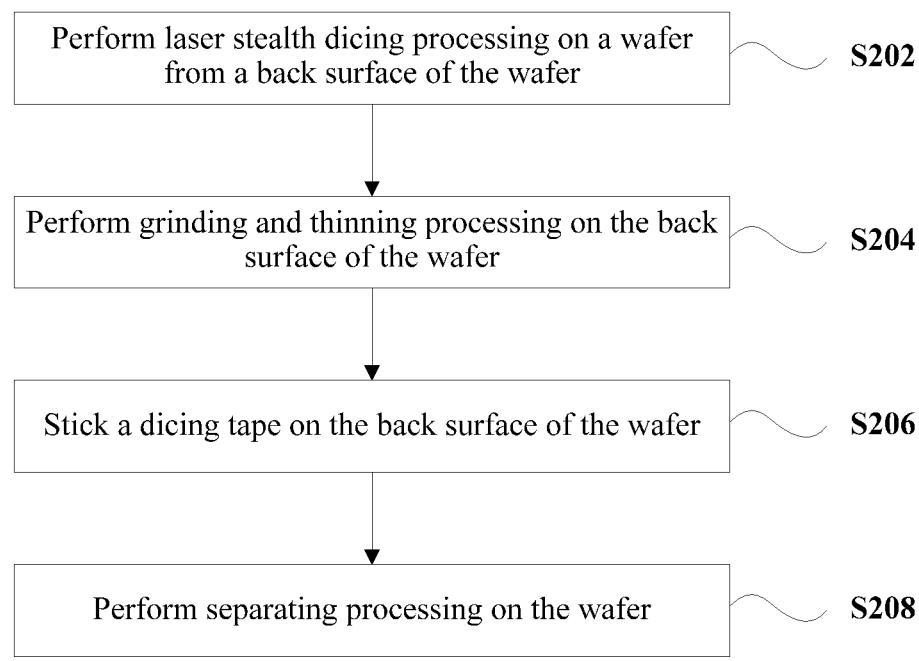
FIG. 2 is a flowchart of a wafer dicing method.

FIG. 2 is a flowchart of a wafer dicing method.

Step S202: Perform laser stealth dicing processing on a wafer from a back surface of the wafer. For example, the wafer may be a silicon chip.

Step S204: Perform grinding and thinning processing on the back surface of the wafer. For example, after the grinding and thinning processing is performed on the back surface of the wafer, the thickness of the wafer after the wafer is thinned is less than or equal to 50 micrometers. For example, the thickness of the wafer after the wafer is thinned may be 20 micrometers, 30 micrometers, or 40 micrometers.

Step S206: Stick a dicing tape on the back surface of the wafer.

Step S208: Perform separation processing on the wafer.

In some implementations, step S208 may include: fixing the wafer on a support platform using the dicing tape; and performing expansion processing on the dicing tape after fixing the wafer on the support platform. In a process of performing the expansion processing on the dicing tape, the wafer is separated into multiple chips. For example, after the wafer is fixed on the support platform, the support platform is raised so that a middle part of the dicing tape is also raised. However, an edge of the dicing tape is fixed, thereby expending the dicing tape. In an expansion process, the dicing tape is under a tensile force pointing around. Because the wafer is stuck on the dicing tape, the wafer is also under the tensile force pointing around, so that the wafer is separated into multiple chips.

In some implementations, in the process of performing the expansion processing on the dicing tape, heating processing is further performed on the dicing tape. The heating processing helps soften the dicing tape. After being heated, the dicing tape shrinks back, which is beneficial to performing the expansion processing on the dicing tape.

In forms of the wafer dicing method in the foregoing implementations, before a dicing tape is stuck on a back surface of a wafer, laser stealth dicing processing is performed on the wafer from the back surface of the wafer so that in a process of performing the laser stealth dicing processing, a laser is directly imposed on the back surface of the wafer, thereby alleviating a laser attenuation problem. In addition, the method can lower requirements on light transmittance of the dicing tape so that an expensive dicing tape of high light transmittance is not needed, thereby reducing costs.

In some implementations, the dicing method may further include: before performing the laser stealth dicing processing, sticking a protection tape on a front surface of the wafer. In some implementations, the protection tape is stuck on the front surface of the wafer so that the front surface of the wafer can be protected in the following process of performing the grinding and thinning processing on the back surface of the wafer. For example, the protection tape may be a backside grinding (BG) tape.

In some implementations, the method may further include: after sticking the dicing tape and before performing the separation processing on the wafer, removing the protection tape. Removal of the protection tape is beneficial to an operation of performing the separation processing on the wafer.

In some implementations, the method may further include: before sticking the protection tape on a front surface of the wafer, performing grooving processing on the front surface of the wafer to form a dicing line. In the step of performing laser stealth dicing processing, a dicing path of the laser stealth dicing is aligned with the dicing line.

In some implementations, the width of the dicing line may be greater than the width of the dicing path of the laser stealth dicing. In some implementations, the width of the dicing line may be less than or equal to 20 micrometers. For example, the width of the dicing line may be 5 micrometers or 10 micrometers. In some implementations, the width of the dicing path may be less than or equal to 2 micrometers. For example, the width of the dicing path may be 0.5 micrometer or 1 micrometer.

In some implementations, a metal layer is formed on the front surface of the wafer. In the step of performing grooving processing on the front surface of the wafer, the metal layer is etched to form the dicing line. In this case, no metal exists in the dicing line, and it is beneficial to performing the separation operation in the following process of performing the separation processing on the wafer, thereby avoiding damage to the chips in the wafer.

In some implementations, the metal layer is formed on the front surface of the wafer, and other structural layers (for example, an oxide layer of silicon) may further be formed. In the step of performing grooving processing on the front surface of the wafer to form a dicing line, the other structural layers on the front surface of the wafer and disposed at the dicing line may further be removed.

FIG. 3A to FIG. 3B, FIG. 4, FIG. 5A and FIG. 5B, and FIG. 6 to FIG. 8 are schematic diagrams of implementation statuses of several phases of a wafer dicing method. The following describes in detail a process of the wafer dicing method with reference to the figures.

Figure 3A:
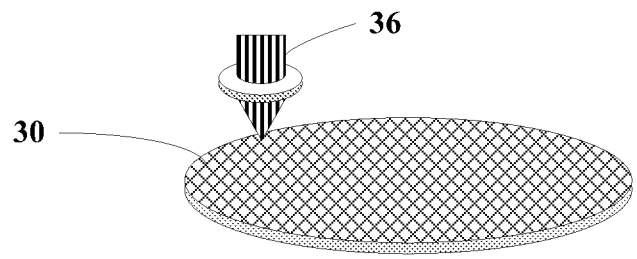
FIG. 3A is a schematic diagram of an implementation status of a phase of a wafer dicing method.
Figure 3B:
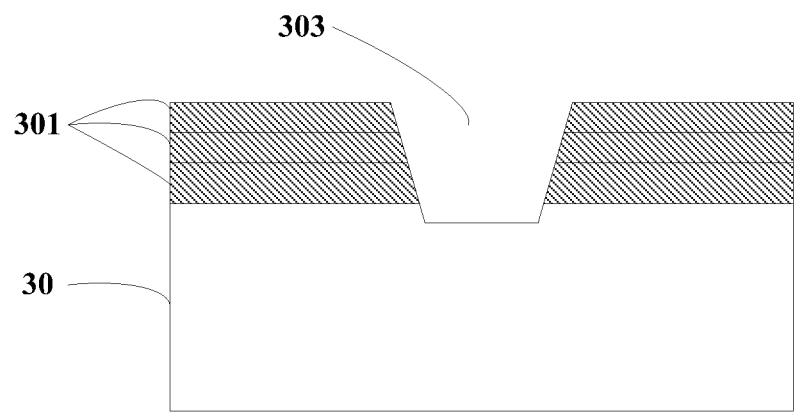
FIG. 3B is a partial schematic sectional view of a wafer in the phase shown in FIG. 3A of the wafer dicing method.

First, as shown in FIG. 3A, grooving processing is performed on a front surface of a wafer 30 to form a dicing line. For example, the wafer 30 may be a silicon chip. In some implementations, the grooving processing may be implemented using a photoetching process and an etching process. A light beam 36 used for the photoetching process is shown in FIG. 3A. For example, as shown in FIG. 3B, multiple metal layers 301 are formed on the front surface of the wafer 30. For example, the metal layers 301 may be etched to form the dicing line 303.

Figure 4:
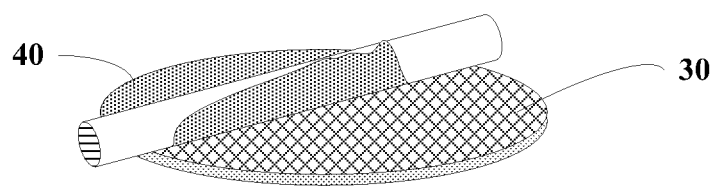
FIG. 4 is a schematic diagram of an implementation status of a phase of a wafer dicing method.

Next, as shown in FIG. 4, a protection tape 40 is stuck on the front surface of the wafer 30. For example, the protection tape may be a BG tape.

Figure 5A:
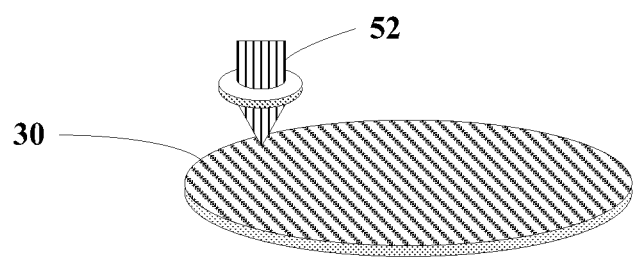
FIG. 5A is a schematic diagram of an implementation status of a phase of a wafer dicing method.

Next, as shown in FIG. 5A, laser stealth dicing processing is performed on the wafer from a back surface of the wafer 30. A laser beam 52 used for the laser stealth dicing processing is shown in FIG. 5A. By means of the laser stealth dicing processing, a Si bond may be damaged in the wafer to form a modified layer, so that the wafer is in a semi-dicing state.

Figure 5B:
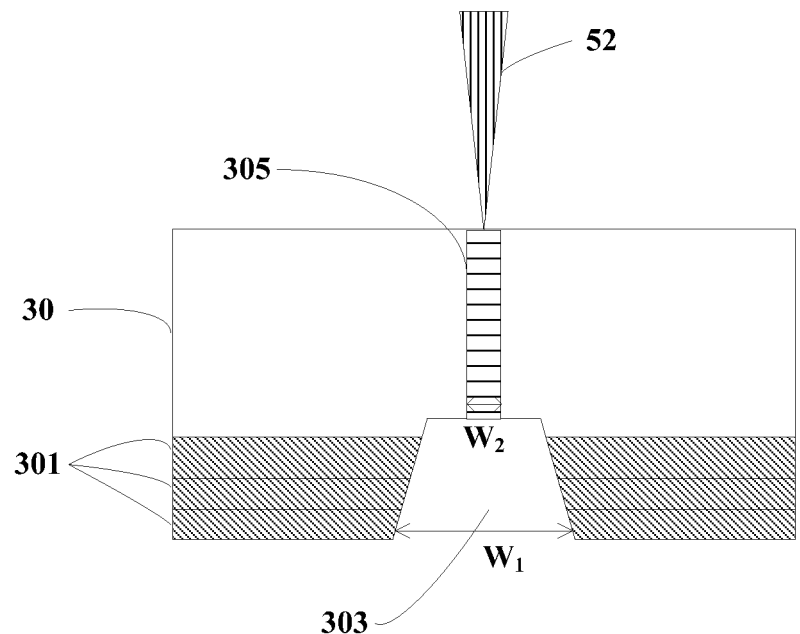
FIG. 5B is a partial schematic sectional view of a wafer in the phase shown in FIG. 5A of the wafer dicing method.

For example, as shown in FIG. 5B, the laser beam 52 is imposed on the back surface of the wafer 30 along a dicing path 305, so as to perform the SD on the wafer.

In some implementations, as shown in FIG. 5B, the width $W_1$ of the dicing line 303 is greater than the width $W_2$ of the dicing path 305 of the laser stealth dicing. In some implementations, the width $W_1$ of the dicing line 303 is less than or equal to 20 micrometers; and the width $W_2$ of the dicing path 305 is less than or equal to 2 micrometers.

Figure 6:
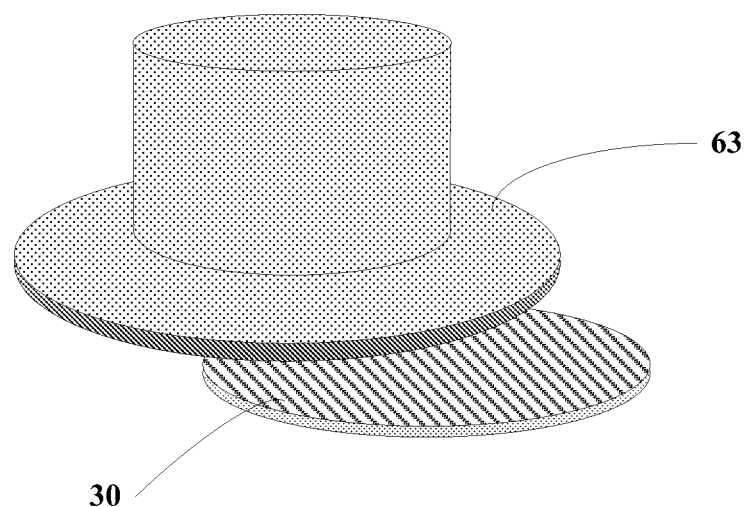
FIG. 6 is a schematic diagram of an implementation status of a phase of a wafer dicing method.

Next, as shown in FIG. 6, a grinding device 63 is used to perform grinding and thinning processing on the back surface of the wafer 30. For example, the thickness of the wafer after the wafer is thinned may be less than or equal to 50 micrometers. The grinding and thinning processing is beneficial to performing separation processing on the wafer subsequently. In a process of the grinding and thinning, the protection tape 40 can protect the front surface of the wafer.

Figure 7:
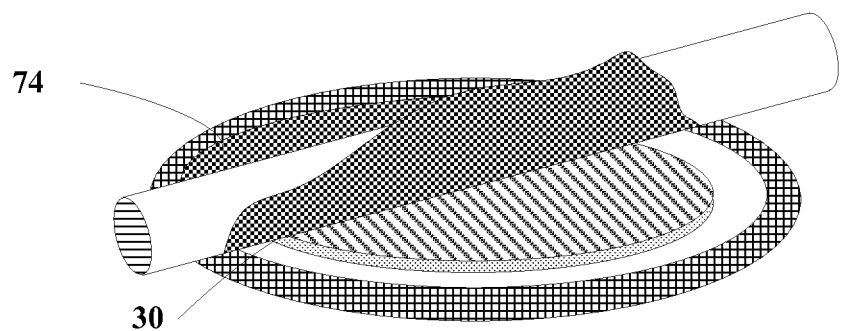
FIG. 7 is a schematic diagram of an implementation status of a phase of a wafer dicing method.

Next, as shown in FIG. 7, a dicing tape 74 is stuck on the back surface of the wafer 30. As shown in FIG. 7, the wafer is stuck at a middle part of the dicing tape 74 and an edge of the dicing tape is stuck on an annular object.

Next, the protection tape 40 is removed.

In the foregoing implementations, the wafer is easy to break up after the laser stealth dicing and the thinning. Therefore, before the dicing tape is stuck, the protection tape is not removed, thereby preventing the wafer from being broken and making it easy to stick the dicing tape. The foregoing step of removing the protection tape after sticking the dicing tape is beneficial to an operation of performing the separation processing on the wafer.

Figure 8:
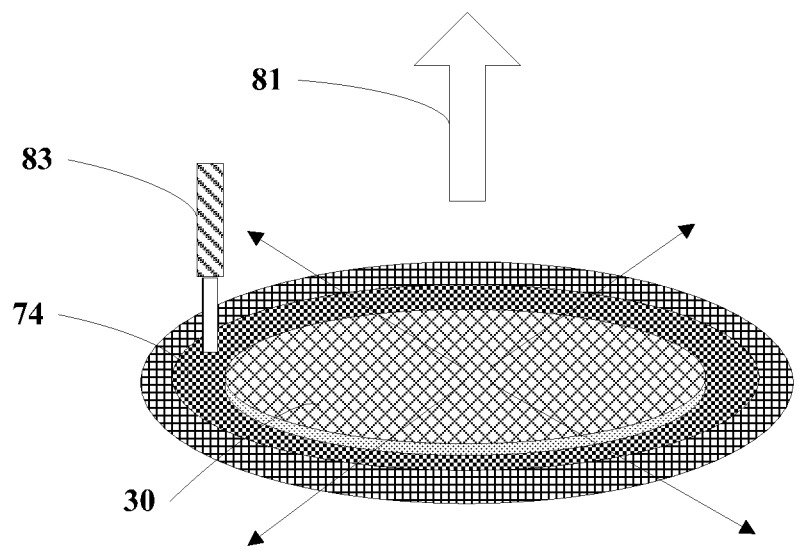
FIG. 8 is a schematic diagram of an implementation status of a phase of a wafer dicing method.

Next, as shown in FIG. 8, the separation processing is performed on the wafer 30. For example, after the wafer is fixed on a support platform (not shown in the figure) using the dicing tape 74, the support platform is raised along a direction 81, so that the middle part of the dicing tape is also raised. However, the edge of the dicing tape is fixed, thereby expending the dicing tape. In a process of expanding the dicing tape, the wafer is under a tensile force such that the wafer is separated into multiple chips along the dicing line. In this step, the dicing tape is expanded so that the wafer is separated into multiple chips in a physical manner after the SD.

As shown in FIG. 8, in a process of performing expansion processing on the dicing tape 74, a heat gun 83 may further be used to perform heating processing on the dicing tape 74. The heat gun may heat the edge of the dicing tape 74 so that it is beneficial to performing the expansion processing on the dicing tape.

In this way, the wafer dicing method is provided according to some implementations of this disclosure. In forms of the method, an SD procedure and a grinding procedure are changed, that is, SD is performed before grinding, so that a laser is directly imposed on a back surface of a wafer, thereby alleviating a laser attenuation problem and a diffraction problem and lowering requirements on light transmittance of a dicing tape.

Embodiments and implementations of a wafer dicing method according to the present disclosure have been described above in detail. To avoid shielding the concepts of this disclosure, some details well known in the art are not described. A person skilled in the art will understand how to implement the technical solution disclosed herein according to the foregoing descriptions.

Although some particular embodiments and implementations of this disclosure are described in detail using examples, a person skilled in the art will understand that the foregoing examples are merely for illustration, and are not intended to limit the scope of this disclosure. A person skilled in the art will understand that modifications may be made to the foregoing embodiments and implementations without departing from the scope and spirit of this disclosure. The scope of this disclosure is limited by the appended claims.

What is claimed is:

1. A wafer dicing method, comprising:
   performing grooving processing on a front surface of a wafer to form a dicing line;
   sticking a protection tape on the front surface of the wafer after performing the grooving processing;
   performing laser stealth dicing processing on the wafer from a back surface of the wafer after sticking the protection tape, wherein a dicing path of the laser stealth dicing is aligned with the dicing line;
   performing grinding and thinning processing on the back surface of the wafer after performing the laser stealth dicing processing;
   sticking a dicing tape on the back surface of the wafer after performing the grinding and thinning processing;
   removing the protection tape after sticking the dicing tape; and
   performing separation processing on the wafer after sticking the dicing tape after removing the protection tape;
   wherein a metal layer is formed on the front surface of the wafer and in the step of performing grooving processing on the front surface of the wafer, the metal layer is etched to form the dicing line.

2. The method according to claim 1, wherein the step of performing separation processing on the wafer comprises:

fixing the wafer on a support platform using the dicing tape; and performing expansion processing on the dicing tape after fixing the wafer on the support platform, wherein in a process of performing the expansion processing on the dicing tape, the wafer is separated into multiple chips.

3. The method according to claim 2, wherein:

in the process of performing the expansion processing on the dicing tape, heating processing is further performed on the dicing tape.

4. The method according to claim 1, wherein:

after the grinding and thinning processing is performed on the back surface of the wafer, the thickness of the wafer after the wafer is thinned is less than or equal to 50 micrometers.

5. The method according to claim 1, wherein:

the width of the dicing line is greater than the width of the dicing path of the laser stealth dicing.

6. The method according to claim 5, wherein:

the width of the dicing line is less than or equal to 20 micrometers; and the width of the dicing path is less than or equal to 2 micrometers.

7. The method according to claim 1, wherein the wafer is a silicon chip.

* * * * *